United States Patent
Birguer

(10) Patent No.: US 7,937,258 B2
(45) Date of Patent: *May 3, 2011

(54) SYSTEM AND METHOD FOR PROVIDING COMPACT MAPPING BETWEEN DISSIMILAR MEMORY SYSTEMS

(75) Inventor: Alexandre Birguer, Santa Clara, CA (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/491,106

(22) Filed: Jun. 24, 2009

(65) Prior Publication Data

US 2009/0259458 A1 Oct. 15, 2009

Related U.S. Application Data

(63) Continuation of application No. 11/278,794, filed on Apr. 5, 2006, now Pat. No. 7,577,558.

(60) Provisional application No. 60/668,863, filed on Apr. 6, 2005.

(51) Int. Cl.
*G06F 9/455* (2006.01)

(52) U.S. Cl. .................. 703/23; 703/13; 703/27; 703/28

(58) Field of Classification Search .................... 703/13, 703/23, 24, 27, 28; 716/1
See application file for complete search history.

(56) References Cited

U.S. PATENT DOCUMENTS

| | | | | |
|---|---|---|---|---|
| 5,036,473 | A | * | 7/1991 | Butts et al. |
| 5,109,353 | A | * | 4/1992 | Sample et al. |
| 5,475,830 | A | * | 12/1995 | Chen et al. |
| 5,551,013 | A | * | 8/1996 | Beausoleil et al. |
| 5,819,065 | A | * | 10/1998 | Chilton et al. |
| 5,960,191 | A | * | 9/1999 | Sample et al. |
| 6,035,117 | A | * | 3/2000 | Beausoleil et al. |
| 6,051,030 | A | * | 4/2000 | Beausoleil et al. |
| 7,370,291 | B2 | * | 5/2008 | Fung et al. |
| 7,577,558 | B2 | * | 8/2009 | Birguer .................. 703/23 |

OTHER PUBLICATIONS

US Office Action May 13, 2008.*
US Office Action Dec. 18, 2008.*
EPO EP Search Report and Office Action Aug. 22, 2006.*
US Notice of Allowance May 29, 2009.*
Ho, William K.C., et al; Logical-to-Physical Memory Mapping for FPGAs with Dual-Port Embedded Arrays FPL 99 LNCS 1673, 1999, pp. 111-123.
Silberschatz, et al; Operating System Concepts, Feb. 1994, Addison-Wesley pp. 268-271.
Krachmer, D., et al Definition and Solution of the Memory Packing Problem for Field-Programmable System IEEE/ACM International Conference on Computer-Aided Design Digest of Technical Papers (ICCAD) San Jose Nov. 6-10, 1994, Los Alamitos, IEEE Comp. Soc. Press US Nov. 6, 1994, pp. 20-26.
Zhou, H., et al., "ILP Method for Memory Mapping in High-Level Synthesis", Microelectronics Reliability, vol. 43, Issue 7, Jul. 2003, pp. 1163-1167.
Ouaiss, I., et al., "Hierarchical Memory Mapping During Synthesis in FPGA_Based Reconfigurable Computers," Proceedings of the Conference on Design, Automation, and Test in Europe, 2001, pp. 650-657.

* cited by examiner

*Primary Examiner* — Hugh Jones
*Assistant Examiner* — Herng-Der Day
(74) *Attorney, Agent, or Firm* — Orrick, Herrington & Sutcliffe LLP

(57) ABSTRACT

A memory mapping system for providing compact mapping between dissimilar memory systems and methods for manufacturing and using same. The memory mapping system can compactly map contents from one or more first memory systems into a second memory system without a loss of memory space in the second memory system. Advantageously, the memory mapping system can be applied to hardware emulator memory systems to more efficiently map design memory systems into an emulation memory system during compilation.

35 Claims, 6 Drawing Sheets

Representation of 2Kx16 Read Port

SYSTEM AND METHOD FOR PROVIDING COMPACT MAPPING BETWEEN DISSIMILAR MEMORY SYSTEMS

CROSS-REFERENCE TO RELATED APPLICATIONS

This application is a continuation application of application Ser. No. 11/278,794, filed on Apr. 5, 2006, now U.S. Pat. No. 7,577,558 which claims the benefit of U.S. Provisional Application Ser. No. 60/668,863, filed on Apr. 6, 2005. Priority to each of the prior applications is expressly claimed, and the disclosures of the applications are hereby incorporated herein by reference in their entireties.

FIELD

The present disclosure relates generally to hardware emulation systems for verifying electronic circuit designs and more particularly, but not exclusively, to compiler systems for mapping between user design memory systems and physical emulation memory systems.

BACKGROUND

Hardware logic emulation (and/or acceleration) systems can be applied to implement a user design via one or more programmable integrated circuits. Such hardware logic emulation systems are commercially available from various vendors, such as Cadence Design Systems, Inc., headquartered in San Jose, Calif.

Typical hardware emulation systems utilize programmable logic devices (or integrated circuit chips) and/or processing devices (or integrated circuit chips) that are programmably interconnected. In programmable logic device-based emulation systems, for example, the logic comprising the user design can be programmed into at least one programmable logic device, such as field programmable gate array (FPGA). The logic embodied in the user design thereby can be implemented, taking an actual operating form, in the programmable logic device. Examples of conventional hardware logic emulation systems using programmable logic devices are disclosed in U.S. Pat. Nos. 5,109,353, 5,036,473, 5,475,830 and 5,960,191, the respective disclosures of which are hereby incorporated herein by reference in their entireties.

Similarly, the user design can be processed in a processor-based emulation system so that its functionality appears to be created in the processing devices by calculating the outputs of the user design. The logic embodied in the user design thereby is not itself implemented in processor-based emulation systems. In other words, the logic embodied in the user design does not take an actual operating form in the processing systems. Illustrative conventional hardware logic emulation systems that use processing devices are disclosed in U.S. Pat. Nos. 5,551,013, 6,035,117 and 6,051,030, the respective disclosures of which are hereby incorporated herein by reference in their entireties.

One primary use for hardware logic emulation systems is debugging user designs. Thereby, any functional errors present in the user designs can be identified and resolved prior to fabrication of the user designs in actual silicon. Circuit designers have used hardware emulation systems for many years to perform such debugging because the alternatives, such as simulation, typically are much slower than emulation. Simulation is a software based approach; whereas, for emulation, the user design is compiled with a testbench to form a machine-executable model. Typically, the testbench is represented as a target system (or board) that can directly interact with the user design. The machine-executable model, once compiled, can be executed via a workstation or personal computer.

To facilitate compiling the machine-executable model, the user design usually is provided in the form of a netlist description. The netlist description describes the components of the user design and the electrical interconnections among the components. The components include each circuit element for implementing the user design. Exemplary conventional circuit elements are combinational logic circuit elements (or gates), sequential logic circuit elements, such as flip-flops and latches, and memory elements, such as static random access memory (SRAM) and dynamic random access memory (DRAM). Memory elements that are incorporated into the user design often are referred to as being "design memory systems." The netlist description can be derived from any conventional source, such as a hardware description language, and is compiled to place the netlist description in a form that can be used by the emulation system.

Each design memory system of the user design is mapped onto a physical emulator memory system of the hardware emulation system during compilation. The emulator memory system typically has a fixed data width. For example, Cadence Design Systems, Inc., of San Jose, Calif., provides a Palladium II accelerator/emulation system with an emulator memory system that includes static random access memory (SRAM) and dynamic random access memory (DRAM). The static random access memory (SRAM) has a fixed data width of 32 bits; whereas, the data width of the dynamic random access memory (DRAM) is 64 bits.

For many memory-rich user designs, the emulator memory system therefore can quickly become a critical system resource. Each design memory system typically is mapped onto the emulator memory system without regard to the data width of the individual design memory systems. Therefore, even design memory systems with very small data widths, such as data widths of 1, 2, or 3 bits, are mapped onto the fixed data width of the emulator memory system. As a result, a significant portion of many memory words in the emulator memory system can be "lost," remaining unused during subsequent emulation. Such inefficient mapping from the design memory systems to the emulator memory system thereby results in a wasteful use of the critical system resource.

Prior attempts to provide more compact mapping between design memory systems and emulator memory systems have provided to be unsatisfactory. In one approach, different design memory systems are mapped onto the same address area of the emulation memory system. This approach, however, is difficult to implement and is not consistently effective. Others have suggested the use of manual methods for mapping the design memory systems onto the emulator memory system. In addition to being extremely difficult to apply to practical user designs, these manual methods have proven to be time consuming and prone to error.

In view of the foregoing, a need exists for an improved system and method for mapping between dissimilar memory systems that overcomes the aforementioned obstacles and deficiencies of currently-available hardware logic emulation systems.

Figure 1:
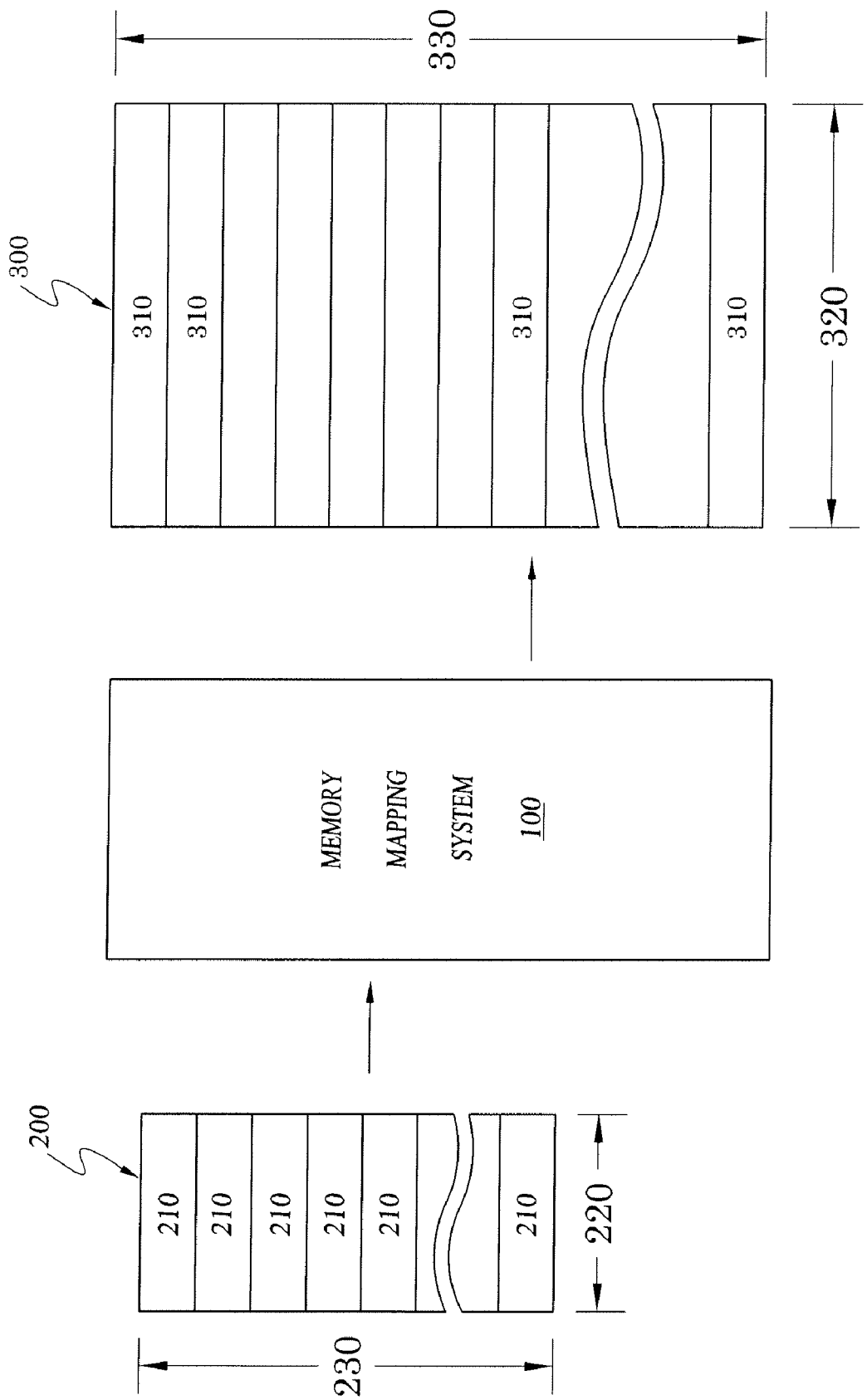
FIG. 1 is an exemplary top-level block diagram illustrating an embodiment of a memory mapping system for providing a compact mapping between two dissimilar memory systems.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not describe every aspect of the preferred embodiments and do not limit the scope of the present disclosure.

DETAILED DESCRIPTION OF THE PREFERRED EMBODIMENTS

Since currently-available hardware emulator memory systems inefficiently map design memory systems during compilation, a memory mapping system that considers the unique data width of each individual memory system to compactly map the memory systems into a common memory system having a fixed data width can prove desirable and provide a basis for a wide range of system applications, such as hardware emulator memory systems. This result can be achieved, according to one embodiment disclosed herein, by employing a memory mapping system 100 as shown in FIG. 1.

The memory mapping system 100 can compactly map contents from one or more first memory systems 200 into a second memory system 300 without a loss of memory space in the second memory system 300. As illustrated in FIG. 1, the first memory system 200 comprises a conventional memory system, such as one or more static random access memory (SRAM) system and/or dynamic random access memory (DRAM) system, for performing conventional memory operations. Exemplary conventional memory operations can include writing data to the first memory system 200, (at least temporarily) storing data within the first memory system 200, and/or reading data from the first memory system 200. As desired, the first memory system 200 can be provided as a physical memory system, such as a semiconductor integrated circuit device, and/or as a virtual memory system, such as a memory primitive. Comprising a plurality of addressable memory registers 210 for storing data, the first memory system 200 has a memory depth 230 that defines a predetermined number of the memory registers 210 and a predetermined data width 220 that sets forth a quantity of data bits that can be stored in each of the memory register 210. A first memory space for the first memory system 200 thereby can be defined by the data width 220 and the memory depth 230 of the first memory system 200.

The second memory system 300 likewise can be provided as a conventional memory system in the manner discussed in more detail above with reference to the first memory system 200. Thereby, the second memory system 300 can comprise a plurality of addressable memory registers 310 and can have a predetermined data width 320 and a memory depth 330. The data width 320 of the second memory system 300 identifies a number of data bits that can be stored in each of the memory registers 310; whereas, the memory depth 330 defines a predetermined number of the memory registers 310. For simplicity, the predetermined data width 220 of the first memory system 200 is shown and described as being equal to a power of two and as being less than the predetermined data width 320 of the second memory system 300, and the memory depth 230 of the first memory system 200 is shown and described as being greater than the predetermined data width 320 of the second memory system 300. A second memory space for the second memory system 300 can be defined by the data width 320 and the memory depth 330 of the second memory system 300.

Although the second memory system 300 can have any conventional data width 320, the construction and operation of the memory mapping system 100 will be shown and described with reference to a second memory system 300 having a data width 320 of sixty-four bits for purposes of illustration. The memory mapping system 100 therefore can map the first memory system 200 with a memory depth 230 that is equal to the $N^{th}$ power of two ($2^N$) and a data width 220 that is equal to the $W^{th}$ power of two ($2^W$) into the second memory system 300 where N is a positive integer that is greater than six (N>6) and W is a positive integer that is less than six (W<6).

Since the second memory system 300 has the data width 320 of sixty-four bits as discussed above, the data width 220 of the first memory system 200 can be equal to 32, 16, 8, 4, 2, or 1; whereas, the memory depth 230 of the first memory system 200 can be equal to 128, 256, 512, 1024, 2048, etc. Thereby, the first memory system 200 can be mapped into the second memory system 300 with a memory depth 330 that is equal to the $[N+W-6]^{th}$ power of two ($2^{N+W-6}$) and, as discussed above, having the data width 320 of sixty-four bits. A more general discussion of the construction and operation of the memory mapping system 100 is set forth below with reference to FIG. 5, wherein the memory mapping system 100 is shown and described as compactly mapping any suitable number of first memory systems 200A-N with arbitrary data widths 220A-N into the second memory system 300.

According to one preferred embodiment, an exemplary method for mapping dissimilar memory systems can comprise:

providing a first memory system comprising a plurality of first memory registers, said first memory system having a first address space with a first memory depth and a first data width;

providing a second memory system comprising a plurality of second memory registers and having a second address space with a second memory depth and a second data width, said first memory depth being greater than said second data width; and mapping said first memory system into said second memory system by:

dividing said first memory system across said first address space into a preselected number of uniform first memory blocks each having a block width equal to said first data width, said preselected number of said first memory blocks being equal to a power of two such that each of said first memory blocks has a block depth equal to a quotient of said first data width divided by said preselected number; and disposing said first memory blocks within adjacent second memory blocks across said second address space of said second memory system.

1. Base Memory Representation

Figure 2:
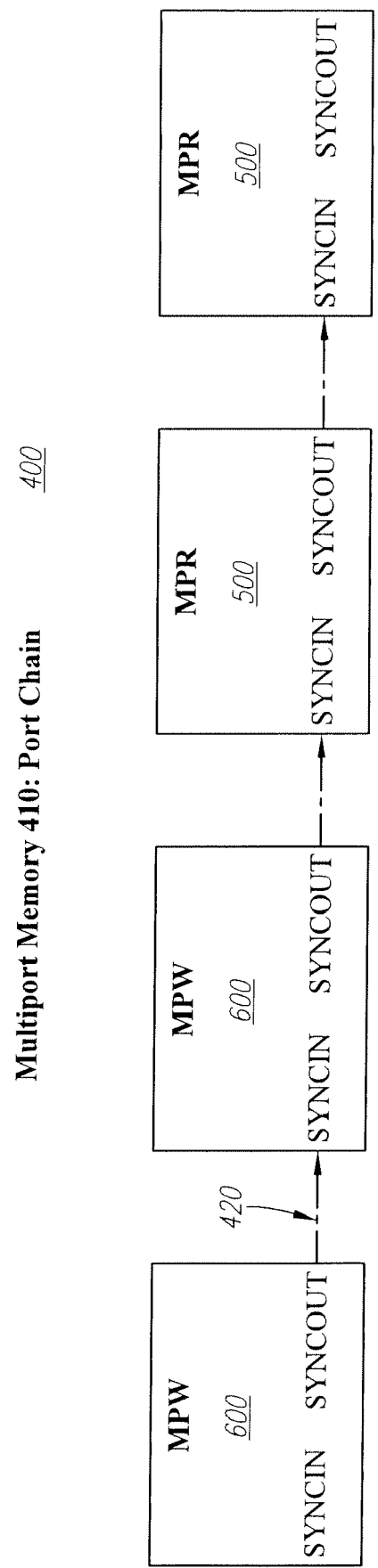
FIG. 2 is an exemplary block diagram illustrating a memory instance, wherein the memory instance is provided as a multiport memory system comprising a port chain of read ports and write ports.

In conventional hardware emulation systems, such as the Palladium II accelerator/emulation system provided by Cadence Design Systems, Inc., of San Jose, Calif., all the design memories (represented by the first memory system 200 shown in FIG. 1) are mapped onto a common emulation memory system (represented by the second memory system 300 shown in FIG. 1). The emulation memory system typically comprises a 64-bit wide dynamic random access memory (DRAM) system and/or a 32-bit wide static random access memory (SRAM) system. As illustrated in FIG. 2, each memory instance 400 in a design database of the hardware emulation system (not shown) is provided via a multiport memory system 410. The multiport memory system 410 is shown as comprising a port chain 420 of read ports 500 and write ports 600.

Figures 3A, 3B:
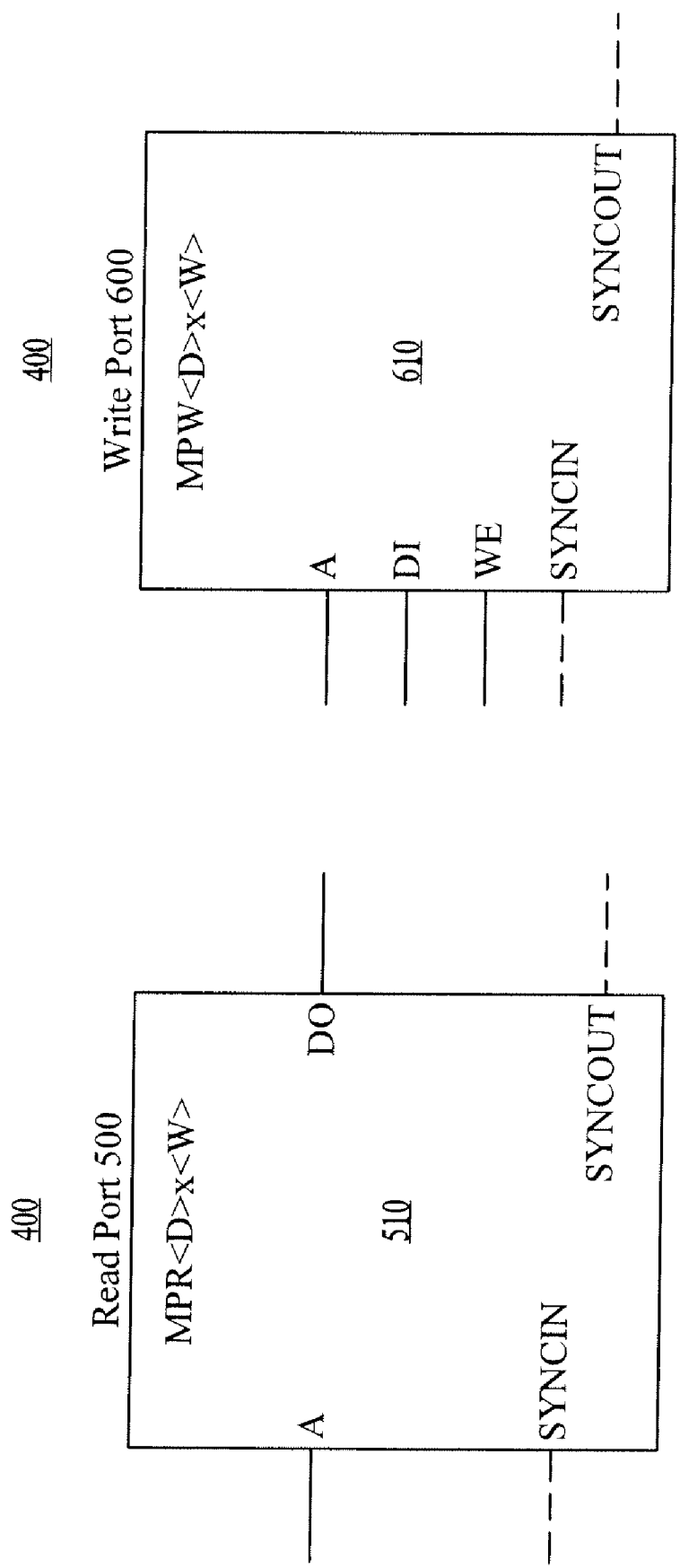
FIG. 3A is an exemplary block diagram illustrating a read port memory primitive for the read ports of FIG. 2.
FIG. 3B is an exemplary block diagram illustrating a write port memory primitive for the write ports of FIG. 2.

Each read port 500 in the port chain 420 can be represented by a read port memory primitive (or MPR primitive) 510 as shown in FIG. 3A; whereas, each write port 600 in the port chain 420 can be represented by a write port memory primitive (or MPW primitive) 610 as shown in FIG. 3B. With reference to FIGS. 3A-B, the read port 500 is denoted as MPR<D>X<W>, and the write port 600 is denoted as MPW<D>X<W> where <D> is memory depth (number of words) and <W> is memory width (number of data bits). The read port memory primitive 510 is shown as having an address input port A and a data output port DO. Similarly, the write port memory primitive 610 has an address input port A, a data input port DI, and a write enable input port WE. The read port memory primitive 510 and the write port memory primitive 610 each likewise include a first communication port SYNCIN and a second communication port SYNCOUT for coupling the memory primitives 510, 610 to form the port chain 420 in the manner as illustrated in FIG. 2.

2. Memory Transformation

2.1. Mapping a Primitive Memory Instance

Let us call a memory instance with data width DW that is equal to a power of two and that is less than 64 (i.e. DW may be equal to 1, 2, 4, 8, 16, 32) a "primitive memory instance." Let us consider a selected primitive memory instance 400 (shown in FIG. 2) with data width DW and depth $D=2^{AW}$ (AW is address bus width). The memory instance 400 can be mapped onto the emulation memory system 300 (shown in FIG. 1) by dividing its address space into $K=2^k$ chunks of equal depth $2^{AW-k}$ and then by mapping these chunks onto the emulation memory system 300 (shown in FIG. 1) side by side. Table 1 illustrates the manner by which k and K can depend on DW.

TABLE 1

| Primitive Memory Mapping Parameters | | | | | | |
|---|---|---|---|---|---|---|
| DW | 1 | 2 | 4 | 8 | 16 | 32 |
| k | 6 | 5 | 4 | 3 | 2 | 1 |
| K | 64 | 32 | 16 | 8 | 4 | 2 |

Each address a of the memory instance 400 can be represented as a=K*(a/K)+a % K, where a/K represents the integer quotient of a divided by K and the a % K represents the integer remainder of a divided by K. Then, the contents N[a] of the memory register associated with the address a of the memory instance 400 can be mapped onto (a % K)-th section of (a/K)-th word of the emulation memory system 300. If the memory instance 400 has a memory depth 230 (shown in FIG. 1) of 2048 words and a data width 220 (shown in FIG. 1) of 16 bits, for example, the memory instance 400 will be mapped onto a 512 word deep area of the emulation memory system 300 as shown in Table 2 (K=4).

TABLE 2

| | Example of Multicolumn Mapping | | | |
|---|---|---|---|---|
| | Bits | | | |
| Words | 6666555555555544<br>3210987654321098 | 4444444433333333<br>7654321098765432 | 3322222222221111<br>1098765432109876 | 1111110000000000<br>5432109876543210 |
| 0 | N[0] | N[1] | N[2] | N[3] |
| 1 | N[4] | N[5] | N[6] | N[7] |
| ... | ... | ... | ... | ... |
| a | N[4*a] | N[4*a + 1] | N[4*a + 2] | N[4*a + 3] |
| ... | ... | ... | ... | ... |
| 510 | N[2040] | N[2041] | N[2042] | N[2043] |
| 511 | N[2044] | N[2045] | N[2046] | N[2047] |

2.2. Primitive Port Models

2.2.1. Read Port Model

Figure 4A:
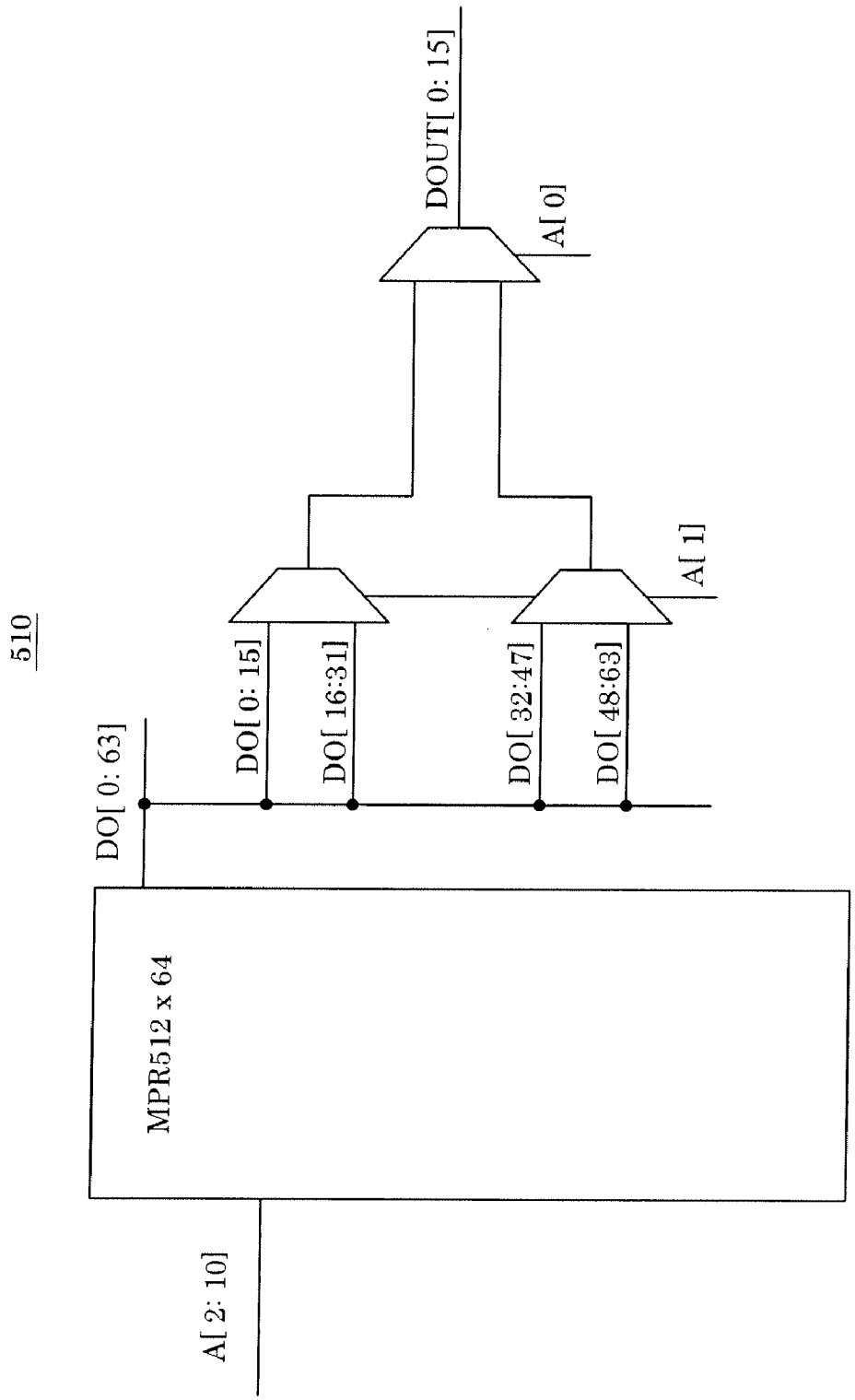
FIG. 4A is a detail drawing illustrating a circuit synthesized by the memory mapping system of FIG. 1 and modeling a 2K×16 read port memory primitive.

Each read port 500 can be synthesized by the memory mapping system 100 (shown in FIG. 1) as a primitive memory instance 400 with depth D and width W. The read ports 500 thereby can be associated with additional logic systems to provide correct functioning (or behavior) during emulation. Returning to FIG. 3A, for example, the primitive memory instance 400 is shown as being represented as 64-bit wide read port memory primitive 510 followed by k levels of multiplexers for choosing the "right" section of the word based on the less significant address bit(s). FIG. 4A shows the representation of a read port 500 of a 2K×16 read port memory primitive 510.

2.2.2. Write Port Model

Figure 4B:
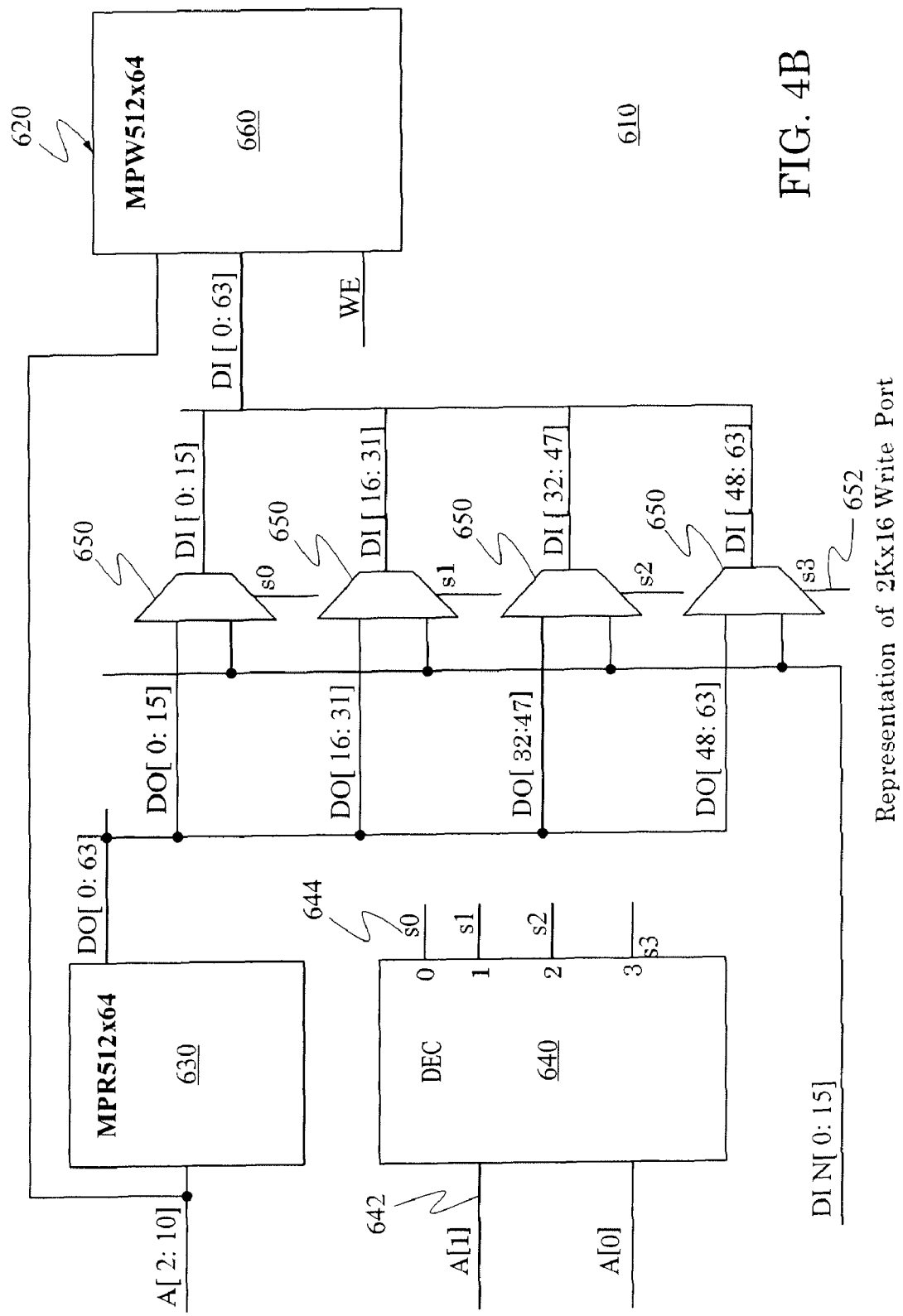
FIG. 4B is a detail drawing illustrating a circuit synthesized by the memory mapping system of FIG. 1 and modeling a 2K×16 write port memory primitive.

Each write port 600 likewise can be synthesized by the memory mapping system 100 (shown in FIG. 1) as a primitive memory instance 400 with depth D and width W. The write ports 600 thereby can be associated with additional logic systems to provide correct functioning (or behavior) during emulation. Turning to FIG. 4B, for example, the write port 600 is represented as a Read-Modify-Write (RMW) circuit 620. The Read-Modify-Write circuit 620 is shown as including a 64-bit wide read port memory primitive 630 that reads the current content of $M[a^h]$ ($a^h$ denotes aw-k most significant bits of the memory address a). The Read-Modify-Write circuit 620 likewise includes a decoder DEC 640 with k inputs 642 and $K=2^k$ outputs 644. The inputs 642 of the decoder DEC 640 are shown as being coupled with less significant address bits; whereas, the outputs 644 of the decoder DEC 640 can be coupled with SEL inputs 652 of a plurality of multiplexers 650. Each of the multiplexers 650 is associated with one section of 64 bit word and either updates it with new input values (just one section) or keeps it unchanged (all the other sections) based on the decoder output values. As shown in FIG. 4B, the Read-Modify-Write circuit 620 also includes a 64 bit wide write port memory primitive 660. The write port memory primitive 660 writes the modified 64 bit word back to the same address. FIG. 4B shows the representation of a write port 600 of a 2K×16 write port memory primitive 610.

2.3. General Transformation

A primitive memory, comprising the memory primitives 510, 610 (shown in FIGS. 53A-B) and having depth equal to $2^n$ and width equal to $2^w$ (w<6, n>6), can be mapped onto the emulation memory system 300 (shown in FIG. 1) area with depth $2^{n+w-6}$ and width 64. Each positive integer W can be factorized in accordance with in Equation 1 where r may be equal to any non-negative integer and $f_i$ (i=1:6) may be equal to 0 or 1.

$$W = r*64 + f_1*32 + f_2*16 + f_3*8 + f_4*4 + f_5*2 + f_6*1 \quad \text{(Equation 1)}$$

A memory instance with depth equal to $2^n$ and width equal to W therefore can be represented as a set of r 64-bit wide memory instances and up to six primitive memory instances. Each primitive memory instance, in turn, can by mapped onto 64 bit wide area of the emulation memory system 300 (shown in FIG. 1) in the manner discussed in more detail above. Exemplary numbers and depths of these illustrative areas of the emulation memory system 300 (shown in FIG. 1) are shown in Table 3. The transformation of a memory instance with depth equal to D and width equal to W (without loss of generality, we may assume W<64) saves D*(64−W)/64 words of the emulation memory system 300. As desired, this value can be referred to as being the memory instance saving weight or just weight. Advantageously, this transformation does not require any search.

TABLE 3

| | Transformation Parameters | | | | | |
|---|---|---|---|---|---|---|
| Depth | $2^{n-1}$ | $2^{n-2}$ | $2^{n-3}$ | $2^{n-4}$ | $2^{n-5}$ | $2^{n-6}$ |
| Number | $f_1$ | $f_2$ | $f_3$ | $f_4$ | $f_5$ | $f_6$ |

3. Presently Preferred Implementation

The described transformation was implemented and tested in IncisiveXE3.0 as a part of et3compile process. Incisive is the tool used for compiling a debugging designs on Cadence's Palladium products. The transformation did increase the number of memory ports (MPR and MPW primitives) and create additional logic gates. If an original memory instance has R MPRs, W MPWs and its data width equals dw (0<dw<64), then the transformation adds, depending on the value of dw, from W MPRs (for dw=1, 2, 4, 8, 16, 32) to 6 W+5 R MPRs plus 5 W MPWs (for dw=63). Transformation of each original MPR adds, depending on dw, from 32 (for dw=32) to 384 (for dw=63) logic gates (primitives). Transformation of each original MPW adds, depending on dw, from 66 (for dw=32) to 492 (for dw=63) logic gates. The transformation may also increase the step count, which slows down the emulation speed. The more memory instances is transformed, the higher the probability of this increase.

Accordingly, the software is trying to minimize the number of memory instances to be transformed. Its default behavior is as follows. It first compares the available size $D_H$ of the emulation memory system 300 (shown in FIG. 1) with the size $D_D$ of the emulation memory system 300 (shown in FIG. 1) required for the given design. If $D_D$ does not exceeds $D_H$, the transformation is not required. Otherwise, the implementation browses the design data base, collects all the "compactible" memory instances, for each of them finds its weight, and transforms these instances in order of decreasing weight. The transformation stops as soon as it saved enough space within the emulation memory system 300.

This behavior may be modified with the following commands (in any combination).

Define the "utilization factor" u for the emulation memory system 300 (by default, u=100). If it is defined, the implementation would compare $D_D$ with $D_H*u/100$ rather than with $D_H$. Setting u<100 would force more memory instances to be transformed; if u=0, all the "compactible" memory instances will be transformed. Setting u>100 decreases the number of memory instances to be transformed; if u exceeds some "big enough value", no memory instance would be transformed.

Force some memory instances to be transformed (specified by names).

Prevent transformation of some memory instances (specified by names).

Define the "minimum transformation depth" (i.e. force transformation of any memory instance with depth equal to or exceeding the given value).

Define the "maximum non-transformation depth" (i.e. prevent transformation of any memory instance with depth equal to or less than the given value).

Given memory width W (W<64), a "memory remainder" can be defined as 64−W. Define the "minimum transformation remainder" (i.e. force transformation of any memory instance with remainder equal to or exceeding the given value).

Define the "maximum non-transformation remainder" (i.e. prevent transformation of any memory instance with remainder equal to or less than the given value).

A transformed memory instance thereby can be represented by one or more "new" memory instances in the manner described above. Each new memory instance gets a unique name uniquely derived from the original name. The list of original names of the transformed memory instances is saved in the design data base, which allows the run time programs to correctly access the memory contents.

From the user point of view, the memory transformation is completely transparent, i.e. only the original memory instance names are used in the user interface. The MPR/MPW primitives and gates created during the transformation are invisible to the user.

4. Practical Results

Implementation of the memory compaction allowed to considerably reduce the hardware requirements for several designs. Three real designs are presented in Table 4.

TABLE 4

Practical Results

| Design | N1 | | N2 | | N3 | |
|---|---|---|---|---|---|---|
| Set | A | B | A | B | A | B |
| Original Gates, M | 2.70 | | 2.08 | | 27.75 | |
| Additional Gates, % | 0.88 | 0.13 | 9.69 | 0.12 | 7.77 | 0.01 |
| Original Nets, M | 2.72 | | 2.12 | | 28.62 | |
| Additional Nets, % | 2.05 | 0.25 | 11.84 | 0.23 | 14.3 | 0.02 |
| Original Memory Instances | 88 | | 622 | | 8468 | |
| Transformed Memory Instances | 88 | 13 | 622 | 18 | 8468 | 24 |
| Original MPR/MPW | 534 | | 2672 | | 39098 | |
| Additional MPR/MPW, % | 44 | 4.5 | 90 | 0.75 | 46.4 | 0.06 |
| Original Depth, M | 225.5 | | 145.4 | | 163.5 | |
| New Depth, M | 104.2 | 104.2 | 18.83 | 19.42 | 124.3 | 139.5 |
| Min. Step Count | 480 | 480 | 600 | 576 | — | 480 |
| Max. Step Count | 640 | 640 | 656 | 640 | — | 480 |
| et3compile Run Time, s | 954 | 943 | 818 | 669 | — | 27880 |
| Mem. Transform. Run Time, s | 3.3 | 2.3 | 10.3 | 4.3 | 187 | 75 |
| Mem. Transform. Run Time, % | 0.35 | 0.24 | 1.26 | 0.64 | — | 0.27 |

For each of these designs two sets of experiments were performed. In the first set (A), the transformation of all "compactible" memory instances was forced. In the second set (B), only a few memory instances with the biggest weights, enough to fit into the given hardware configuration were transformed. Each set consisted of at least 5 trials, so Table 4 contains both minimum and maximum values for Step Count. For Run Time parameters, the average values are shown.

It is worth noting that the numbers of additional gates and nets were big enough for set A and negligibly small for set B. The execution times of memory transformation were negligibly small, especially for set B. Also, the transformation of only a small, sometimes even tiny subset of memory instances, can provide for significant memory savings. No significant difference in step count occurred between sets A and B.

Figure 5:
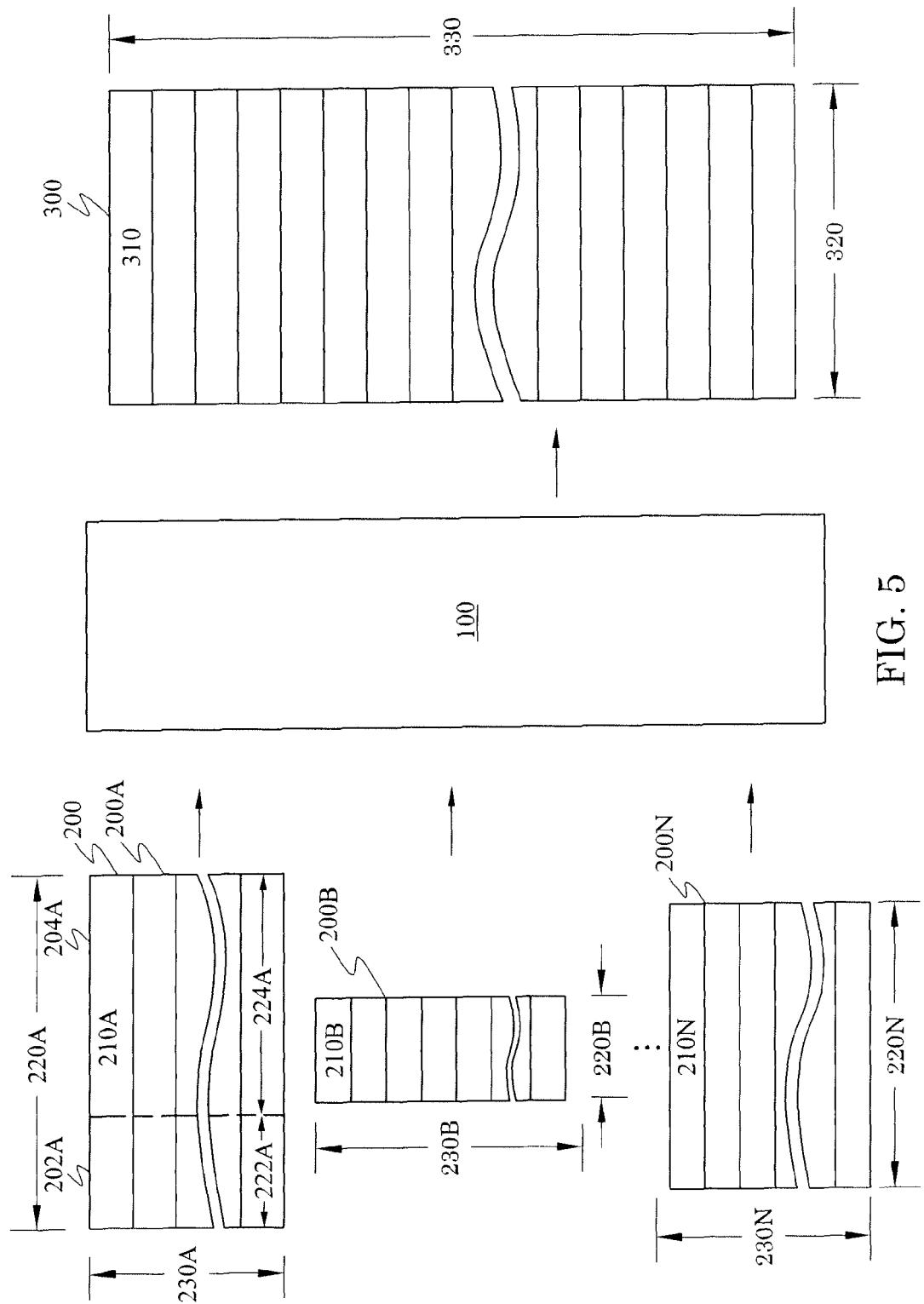
FIG. 5 is an exemplary block diagram illustrating an alternative embodiment of the memory mapping system of FIG. 1, wherein the memory mapping system is configured to compactly map a plurality of memory systems to a common memory system.

Although shown and described with reference to FIG. 1 as mapping the first memory systems 200 into the second memory system 300 for purposes of illustration only, the memory mapping system 100 can compactly map contents from any preselected number N of first memory systems 200A-N into a second memory system 300 without a loss of memory space in the second memory system 300 as illustrated in FIG. 5. Each of the first memory systems 200A-N comprises a conventional memory system in the manner discussed above with reference to the first memory system 200 (shown in FIG. 1). The first memory systems 200A-N respectively have memory depths 230A-N and predetermined data widths 220A-N. The second memory system 300 likewise can be provided as a conventional memory system in the manner discussed in more detail above with reference to FIG. 1 and can have a predetermined data width 320 and a memory depth 330.

As illustrated in FIG. 5, the memory depths 230A-N of the first memory systems 200A-N can include different and/or uniform memory depths; whereas, the data widths 220A-N likewise can be different and/or uniform. Each of the predetermined data widths 220A-N can be provided in the manner set forth in more detail above with reference to the predetermined data width 220 (shown in FIG. 1), and the memory depths 230A-N each can be provided in the manner discussed above with reference to the memory depth 230 (shown in FIG. 1). Each of the first memory systems 200A-N can be mapped to the second memory system 300 in the manner set forth above.

Advantageously, the memory mapping system 100 can separate one or more of the first memory systems 200A-N into any suitable predetermined number of first memory portions. The first memory system 200A, for example, is shown as being separated along the data width 220A into two first memory portions 202A, 204A. Stated somewhat differently, the data width 220A of the first memory system 200A can be separated into two data sub-widths 222A, 224A. The memory portion 202A therefore has a memory subspace defined by the data sub-width 222A and the memory depth 230A; whereas, a memory subspace for the memory portion 204A is defined by the data sub-width 224A and the memory depth 230A. Thereby, if the data width 220A of the first memory system 200A is not equal to a power of two, the memory mapping system 100 can separate the first memory system 200A into a plurality of first memory portions, such as memory portions 202A, 204A, such that each memory portion has a data sub-width 222A, 224A that is equal to a power of two.

For example, the first memory system 200A can have a data width 220A that is equal to five bits. Since the five-bit data width 220A is not equal to a power of two, the memory mapping system 100 can separate the data width 220A into a data sub-width 222A of four bits and a data sub-width 224A of one bit, each being equal to a power of two. The first memory system 200A thereby can be separated into the memory portion 202A having a four-bit data sub-width 222A and the memory portion 204A having a one-bit data sub-width 224A. The memory mapping system 100 therefore can process each of the memory portions 202A, 204A in the manner set forth in more detail above, to compactly map the first memory system 200A into the second memory system 300. Accordingly, the memory mapping system 100 can compactly map the first memory systems 200A-N with arbitrary data widths 220A-N into the second memory system 300.

The present disclosure is susceptible to various modifications and alternative forms, and specific examples thereof have been shown by way of example in the drawings and are herein described in detail. It should be understood, however, that the present disclosure is not to be limited to the particular forms or methods disclosed, but to the contrary, the present disclosure is to cover all modifications, equivalents, and alternatives.

What is claimed is:

1. A method for mapping a source memory system into a destination memory system, the source memory system having a source address space with a source memory depth and a source data width, the destination memory system comprising a plurality of destination memory blocks within a destination address space, the destination address space having a destination memory depth and a destination data width that is equal to a predetermined positive integer power of two, the source address space being less than the destination address space, the method comprising:

partitioning the source address space across the source data width into a plurality of source memory portions, each source memory portion having a portion data width being equal to a preselected positive integer power of two and being less than the destination data width;

dividing each of the source memory portions across the source memory depth into a preselected number of uniform source memory blocks each having a block width equal to an associated portion data width, said preselected number of the source memory blocks being equal to a positive integer power of two such that each of the source memory blocks for a selected source memory portion has a block depth equal to a positive integer quotient of the source memory depth divided by said preselected number of the source memory blocks for the selected source memory portion; and mapping each of the source memory blocks of the source memory portions onto each of the plurality of destination memory blocks across the destination address space of the destination memory system in a contiguous manner, wherein said partitioning the source address space, said dividing each of the source memory portions, and said mapping the source memory blocks are implemented via a processor-based system, wherein said dividing each of the source memory portions comprises dividing each of the source memory portions into a different preselected number of the uniform source memory blocks, wherein the destination data width is a positive integer power of two, and wherein said dividing each of the source memory portions includes determining said preselected number of the source memory blocks for the selected source memory portion as a positive integer quotient of the destination data width divided by the portion data width associated with the selected source memory portion.

2. The method of claim 1, wherein said partitioning the source address space includes partitioning the source address space such that each of the portion data widths is equal to a different preselected positive integer power of two.

3. The method of claim 2, wherein said partitioning the source address space includes partitioning the source address space such that none of the portion data widths is equal to a predetermined positive integer power of two.

4. The method of claim 1, wherein said partitioning the source address space includes partitioning the source address space such that the plurality of source memory portions comprises contiguous source data bits across the source data width.

5. The method of claim 1, wherein said dividing each of the source memory portions comprises dividing each of the source memory portions that comprises more than three source memory registers such that each of the source memory blocks comprises contiguous source memory registers of the source memory system.

6. The method of claim 1, wherein data bits of the source memory blocks are less than half of data bits of the destination data width, and wherein said mapping the source memory blocks comprises mapping the source memory blocks associated with the selected source memory portion across contiguous destination data bits of the destination data width.

7. The method of claim 6, wherein said mapping the source memory blocks comprises mapping a preselected source memory block associated with the selected source memory portion across one of a corresponding number of most significant destination data bits of the destination data width and a corresponding number of least significant destination data bits of the destination data width.

8. The method of claim 6 wherein said mapping the source memory blocks comprises mapping the source memory blocks associated with the selected source memory portion across the destination address space such that the source memory blocks span the destination data width.

9. The method of claim 1, wherein said mapping the source memory blocks comprises mapping the source memory blocks associated. with the selected source memory portion across contiguous destination memory registers of the destination memory system.

10. The method of claim 9, wherein said mapping the source memory blocks. comprises mapping the source memory blocks for each respective source memory portion across contiguous destination memory registers of the destination memory system.

11. The method of claim 9, wherein said mapping the source memory blocks comprises mapping the source memory blocks for each respective source memory portion within a predetermined number of the destination memory registers, the predetermined number of the destination memory registers. being equal to a product of a number of source memory registers associated with the source memory depth and a quotient of the source. data width and the destination data width.

12. A computer program product for mapping a source memory system into a destination memory system, the source memory system having a source address space with a source memory depth and a source data width, the destination memory system comprising a plurality of destination memory blocks within a destination address space, the destination address space having a destination memory depth and a destination data width that is less than the source data width and that is equal to a predetermined positive integer power of two, the source address space being less than the destination address space, the computer program product being encoded on one or more non-transitory machine-readable storage media and comprising:

instruction for partitioning the source address space across the source data width into a plurality of source memory portions, each source memory portion having a portion data width being equal to a preselected positive integer power of two and being less than the destination data width;

instruction for dividing each of the source memory portions across the source memory depth into a preselected number of uniform source memory blocks each having a block width equal to an associated portion data width, said preselected number of the source memory blocks being equal to a positive integer power of two such that each of the source memory blocks for a selected source memory portion has a block depth equal to a positive integer quotient of the source memory depth divided by said preselected number of the source memory blocks for the selected source memory portion; and instruction for mapping each of the source memory blocks of the source memory portions onto each of the plurality of destination memory blocks across the destination address space of the destination memory system in a contiguous manner, wherein said instruction for dividing each of the source memory portions comprises instruction for dividing each of the source memory portions into a different preselected number of the uniform source memory blocks, wherein the destination data width is a positive integer power of two, and wherein said instruction for dividing each of the source memory portions includes instruction for determining said preselected number of the source memory blocks for the selected source memory portion as a positive integer quotient of the destination data width divided by the portion data width associated with the selected source memory portion.

13. The computer program product of claim 12, wherein said instruction for partitioning the source address space includes instruction for partitioning the source address space such that each of the portion data widths is equal to a different preselected positive integer power of two.

14. The computer program product of claim 12, wherein said instruction for partitioning the source address space includes instruction for partitioning the source address space such that the plurality of source memory portions comprises contiguous source data bits across the source data width.

15. The computer program product of claim 12, wherein said instruction for dividing each of the source memory portions comprises instruction for dividing each of the source memory portions that comprises more than three source memory registers such that each of the source memory blocks comprises contiguous source memory registers of the source memory system.

16. The computer program product of claim 12, wherein data bits of the source memory blocks are less than half of data bits of the destination data width, and wherein said instruction for mapping the source memory blocks comprises instruction for mapping the source memory blocks associated with the selected source memory portion across contiguous destination data bits of the destination data width.

17. The computer program product of claim 16, wherein said instruction for mapping the source memory blocks comprises instruction for mapping a preselected source memory block associated. with the selected source memory portion across one of a corresponding number of most significant destination data bits of the destination data width and a corresponding number of least significant destination data bits of the destination data width.

18. The computer program product of claim 16, wherein said instruction for mapping the source memory blocks comprises instruction for mapping the source memory blocks associated with the selected source memory portion across the destination address space such that the source memory blocks span the destination data width.

19. The computer program product of claim 12, wherein said instruction for mapping the source memory blocks comprises instruction for mapping the source memory blocks associated with the selected source memory portion across contiguous destination memory registers of the destination memory system.

20. The computer program product of claim 19, wherein said instruction for mapping the source memory blocks comprises instruction for mapping the source memory blocks for each respective source memory portion across contiguous destination memory registers of the destination memory system.

21. The computer program product of claim 19, wherein said instruction for mapping the source memory blocks comprises instruction for mapping the source memory blocks for each respective source. memory portion within a predetermined number of the destination memory registers, the predetermined number of the destination memory registers being equal to a product of a number of source memory registers associated with the source memory. depth and a quotient of the source data width and the destination data width.

22. A system for mapping a source memory system comprising a plurality of source memory registers, the source memory system having a source address space with a source memory depth and a source data width, comprising:

a destination memory system comprising a plurality of destination memory registers and having a destination address space with a destination memory depth and a destination data width that is less than the source data width and that is equal to a predetermined positive integer power of two, the source address space being less than said destination address space; and a processor-based system that partitions the source address space across the source data width into a plurality of source memory portions, each source memory portion having a portion data width being equal to a preselected positive integer power of two and being less than said destination data width, said processor-based system dividing each of said source memory portions across the source memory depth into a preselected number of uniform source memory blocks each having a block width equal to an associated portion data width, said preselected number of the source memory blocks being equal to a positive integer power of two such that each of the source memory blocks for a selected source memory portion has a block depth equal to a positive integer quotient of the source memory depth divided by said preselected number of said source memory blocks for the selected source memory portion, wherein said processor-based system maps each of the source memory blocks of the source memory portions onto each of the plurality of destination memory blocks across said destination address space of said destination memory system in a contiguous manner, wherein said processor-based system divides each of the source memory portions into a different preselected number of the uniform source memory blocks, wherein the destination data width is a positive integer power of two, and wherein said processor-based system determines said preselected number of the source memory blocks for the selected source memory portion as a positive integer quotient of the destination data width divided by the portion data width associated with the selected source memory portion.

23. The system of claim 22, wherein said destination memory system includes a predetermined destination data width selected from a group consisting of thirty-two bits and sixty-four bits.

24. The system of claim 22, wherein said processor-based system partitions the source address space such that each of the portion data widths is equal to a different preselected positive integer power of two.

25. The system of claim 22, wherein said processor-based system partitions the source address space such that the plurality of source memory portions comprises contiguous source data bits across the source data width.

26. The system of claim 22, wherein said processor-based system divides each of the source memory portions that comprises more than three source memory registers such that each of the source memory blocks comprises contiguous source memory registers of the source memory system.

27. The system of claim 22, wherein data bits of the source memory blocks are less than half of data bits of the destination data width, and wherein said processor-based system maps the source memory blocks associated with the selected source memory portion across contiguous destination data bits of said destination data width.

28. The system of claim 27, wherein said processor-based system maps a preselected source memory block associated with the selected source memory portion across one of a corresponding number of most significant destination data bits of said destination data width and a corresponding number of least significant destination data bits of said destination data width.

29. The system of claim 27, wherein said processor-based system maps the source memory blocks associated with the selected source memory portion across said destination address space such that the source memory blocks span said destination data width.

30. The system of claim 22, wherein said processor-based system maps the source memory blocks associated with the selected source memory portion across contiguous destination memory registers of said destination memory system.

31. The system of claim 30, wherein said processor-based system maps the source memory blocks for each respective source memory portion across contiguous destination memory registers of said destination memory system.

32. The system of claim 22, wherein the source memory system comprises a multiport memory system having a port chain. with at least one read port and at least one write port.

33. The system of claim 32, wherein said processor-based system synthesizes a selected read port of the source memory system as a read port memory primitive having the source memory depth and the source data width.

34. The system of claim 32, wherein said processor-based system synthesizes a selected write port of the source memory system as a write port memory primitive having the source memory depth and the source data width.

35. The system. of claim 22, wherein said destination. memory system comprises an emulation memory system, and wherein said processor-based system comprises a processor-based emulation system for mapping a design memory system into said emulation memory system.

* * * * *